US008502560B2

(12) United States Patent
Taguchi et al.

(10) Patent No.: US 8,502,560 B2
(45) Date of Patent: Aug. 6, 2013

(54) OUTPUT CIRCUIT AND OUTPUT CONTROL SYSTEM (75) Inventors: Takashi Taguchi, Tokyo (JP); Hiroyuki Ideno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/235,953

(22) Filed: Sep. 19, 2011

(65) Prior Publication Data
US 2012/0229164 A1    Sep. 13, 2012

(30) Foreign Application Priority Data
Mar. 9, 2011  (JP) ................................. 2011-051731

(51) Int. Cl.
*H03K 19/0175*    (2006.01)

(52) U.S. Cl.
USPC .................... 326/83; 326/68; 326/81; 326/86; 327/108; 327/109

(58) Field of Classification Search
USPC ................. 326/62, 63, 65, 68, 80–83, 56–58, 326/87, 86; 327/108–109, 333
See application file for complete search history.

(56) References Cited

U.S. PATENT DOCUMENTS

| | | | | | |
|---|---|---|---|---|---|
| 5,300,835 | A | * | 4/1994 | Assar et al. | 326/68 |
| 5,892,371 | A | * | 4/1999 | Maley | 326/81 |
| 6,292,025 | B1 | * | 9/2001 | Okumura | 326/58 |
| 6,501,306 | B1 | * | 12/2002 | Kim et al. | 327/112 |
| 2005/0258864 | A1 | * | 11/2005 | Chen et al. | 326/81 |
| 2006/0091907 | A1 | * | 5/2006 | Khan | 326/81 |
| 2009/0002027 | A1 | * | 1/2009 | Lee | 326/80 |

FOREIGN PATENT DOCUMENTS

| | | |
|---|---|---|
| JP | 2010-09-83342 | 1/1980 |
| JP | 09-083342 | 3/1997 |
| JP | 2000-278110 | 10/2000 |
| JP | 2001-265297 | 9/2001 |
| JP | 2002-185299 | 6/2002 |
| JP | 2005-197478 | 10/2002 |
| JP | 2002-298582 | 7/2005 |

OTHER PUBLICATIONS

Japanese Office Action issued on Jun. 4, 2013 with English translation.

* cited by examiner

*Primary Examiner* — Shawki Ismail
*Assistant Examiner* — Christopher Lo
(74) *Attorney, Agent, or Firm* — White & Case LLP (57) ABSTRACT

An output circuit which outputs an output signal based on an input signal from an output terminal and brings the output terminal into a high impedance state in response to an impedance control signal. The output circuit includes an output pMOS transistor connected at a source thereof to a first power supply. The output circuit includes an output nMOS transistor connected between a drain of the output pMOS transistor and ground. The output circuit includes an output terminal connected between the drain of the output pMOS transistor and a drain of the output nMOS transistor. The output circuit includes a first level shifter circuit which outputs a first gate control signal from a first gate control terminal to control on/off of the output pMOS transistor. The output circuit includes a second level shifter circuit which outputs a second gate control signal from a second gate control terminal to control on/off of the output nMOS transistor.

20 Claims, 6 Drawing Sheets

| IN | DIS | A | /A | DISX | /DISX | OUT |
|----|-----|---|----|------|-------|-----|
| 0 | 0 | 0 | 1 | 0 | 1 | 1 |
| 1 | 0 | 1 | 0 | 0 | 1 | 0 |
| 0 | 1 | HiZ | HiZ | 1 | 0 | HiZ |
| 1 | 1 | HiZ | HiZ | 1 | 0 | HiZ |

| IN | DIS | A | B | DISX | /DISX | OUT |
|---|---|---|---|---|---|---|
| 0 | 0 | 0 | 0 | 0 | 1 | 1 |
| 1 | 0 | 1 | 1 | 0 | 1 | 0 |
| 0 | 1 | 0 | 1 | 1 | 0 | HiZ |
| 1 | 1 | 0 | 1 | 1 | 0 | HiZ |

OUTPUT CIRCUIT AND OUTPUT CONTROL SYSTEM

CROSS-REFERENCE TO RELATED APPLICATION

This application is based upon and claims the benefit of priority from the prior Japanese Patent Application No. 2011-051731, filed on Mar. 9, 2011, the entire contents of which are incorporated herein by reference.

BACKGROUND

1. Field

Embodiments described herein relate generally to a output circuit outputting a signal and an output control system.

2. Background Art

In a conventional level shifter circuit (output circuit) provided between different power supplies, a stand-by current flows when its output is not yet used (its output is disabled).

Therefore, a switch circuit is provided in a power supply of the level shifter circuit in order to cut off the stand-by current.

However, the switch circuit has a size which can let flow a current required to drive the level shifter circuit fast, and a circuit area of the level shifter circuit becomes large.

Furthermore, there is a problem that the operation speed of the level shifter circuit is made slow by influence of an on-resistance of the switch circuit.

DETAILED DESCRIPTION

An output circuit which outputs an output signal based on an input signal from an output terminal and brings the output terminal into a high impedance state in response to an impedance control signal, the output circuit according to an embodiment. The output circuit includes an output pMOS transistor connected at a source thereof to a first power supply. The output circuit includes an output nMOS transistor connected between a drain of the output pMOS transistor and ground. The output circuit includes an output terminal connected between the drain of the output pMOS transistor and a drain of the output nMOS transistor. The output circuit includes a first level shifter circuit which outputs a first gate control signal from a first gate control terminal to control on/off of the output pMOS transistor. The output circuit includes a second level shifter circuit which outputs a second gate control signal from a second gate control terminal to control on/off of the output nMOS transistor.

The first level shifter circuit includes a first pMOS transistor connected at a source thereof to the first power supply. The first level shifter circuit includes a first nMOS transistor connected between a drain of the first pMOS transistor and the ground, and connected at a gate thereof to a first logic terminal supplied with a first logic signal. The first level shifter circuit includes a second pMOS transistor connected at a source thereof to the first power supply. The first level shifter circuit includes a second nMOS transistor connected between a drain of the second pMOS transistor and the ground, and connected at a gate thereof to a second logic terminal supplied with a second logic signal which is obtained by inverting a logic of the first logic signal. The first level shifter circuit includes a first control pMOS transistor connected at a source thereof to the first power supply, connected at a drain thereof to a drain of the second pMOS transistor, and connected at a gate thereof to a first control terminal supplied with a first output control signal based on the impedance control signal. The first level shifter circuit includes a first control nMOS transistor connected at a drain thereof to the gate of the second nMOS transistor, connected at a source to the ground, and connected at a gate thereof to a second control terminal supplied with a second output control signal based on the impedance control signal.

The second level shifter circuit includes a third pMOS transistor connected at a source to the first power supply. The second level shifter circuit includes a third nMOS transistor connected between a drain of the third pMOS transistor and the ground, and connected at a gate thereof to a third logic terminal supplied with a third logic signal. The second level shifter circuit includes a fourth pMOS transistor connected at a source thereof to the first power supply. The second level shifter circuit includes a fourth nMOS transistor connected between a drain of the fourth pMOS transistor and the ground, and connected at a gate thereof to a fourth logic terminal supplied with a fourth logic signal which is obtained by inverting a logic of the third logic signal. The second level shifter circuit includes a second control nMOS transistor connected at a source thereof to the ground, connected at a drain thereof to a drain of the fourth nMOS transistor, and connected at a gate thereof to a third control terminal supplied with the second output control signal. The second level shifter circuit includes a third control nMOS transistor connected at a drain thereof to the gate of the third nMOS transistor, connected at a source thereof to the ground, and connected at a gate thereof to a fourth control terminal supplied with the second output control signal.

Hereafter, embodiments of an output circuit according to the present invention will be described with reference to the drawings.

First Embodiment

Figure 1:
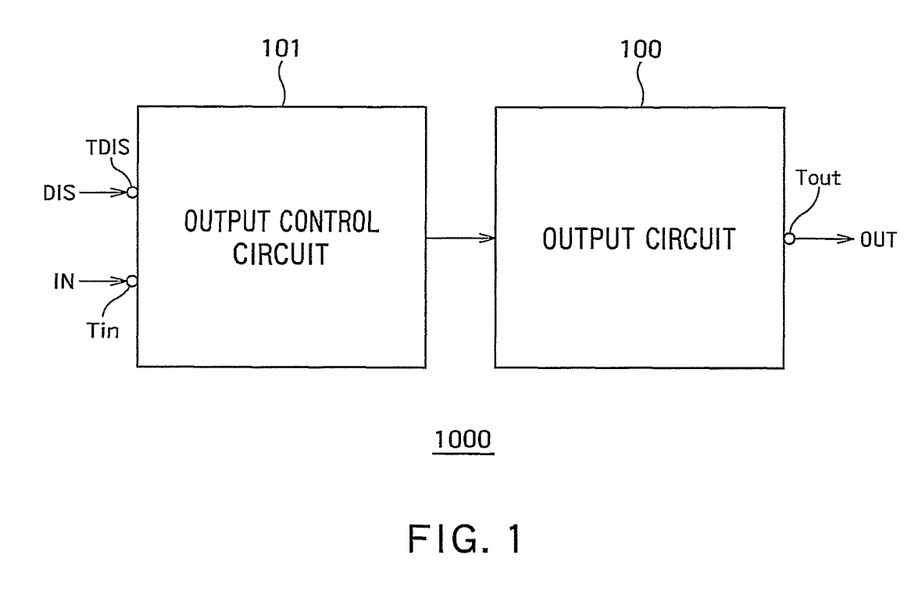
FIG. 1 is a diagram showing an example of a configuration of an output control system 1000.

FIG. 1 is a diagram showing an example of a configuration of an output control system 1000.

As shown in FIG. 1, the output control system 1000 includes an output control circuit 101 and an output circuit 100.

The output control circuit 101 is adapted to output a logic signal based on an input signal IN which is input via an input terminal Tin and output an output control signal based on an impedance control signal DIS which is input via an impedance control input terminal TDIS.

Incidentally, the input signal IN is driven with, for example, a second power supply voltage VDDL which is supplied from a second power supply and which is lower than a first power supply voltage VDDH. And the input signal IN is supplied from a controller (not illustrated) which controls a NAND flash memory (not illustrated).

Furthermore, the impedance control signal DIS is supplied from, for example, a CPU (not illustrated) driven with the second power supply voltage VDDL.

The output circuit 100 is adapted to output an output signal OUT from an output terminal Tout in accordance with the logic signal. Furthermore, the output circuit 100 is adapted to bring the output terminal Tout into a high impedance state (a state in which the output terminal Tout is not electrically connected to (i.e., is insulated from) an internal circuit in the output circuit 100) in accordance with the output control signal.

In other words, the output circuit 100 is adapted to output the output signal OUT based upon the input signal IN, from the output terminal Tout and bring the output terminal Tout into the high impedance state in accordance with the impedance control signal DIS.

Incidentally, the output signal OUT is adapted to be supplied to, for example, a NAND flash memory (not illustrated) driven with the first power supply voltage VDDH which is supplied from a first power supply.

Figure 2:
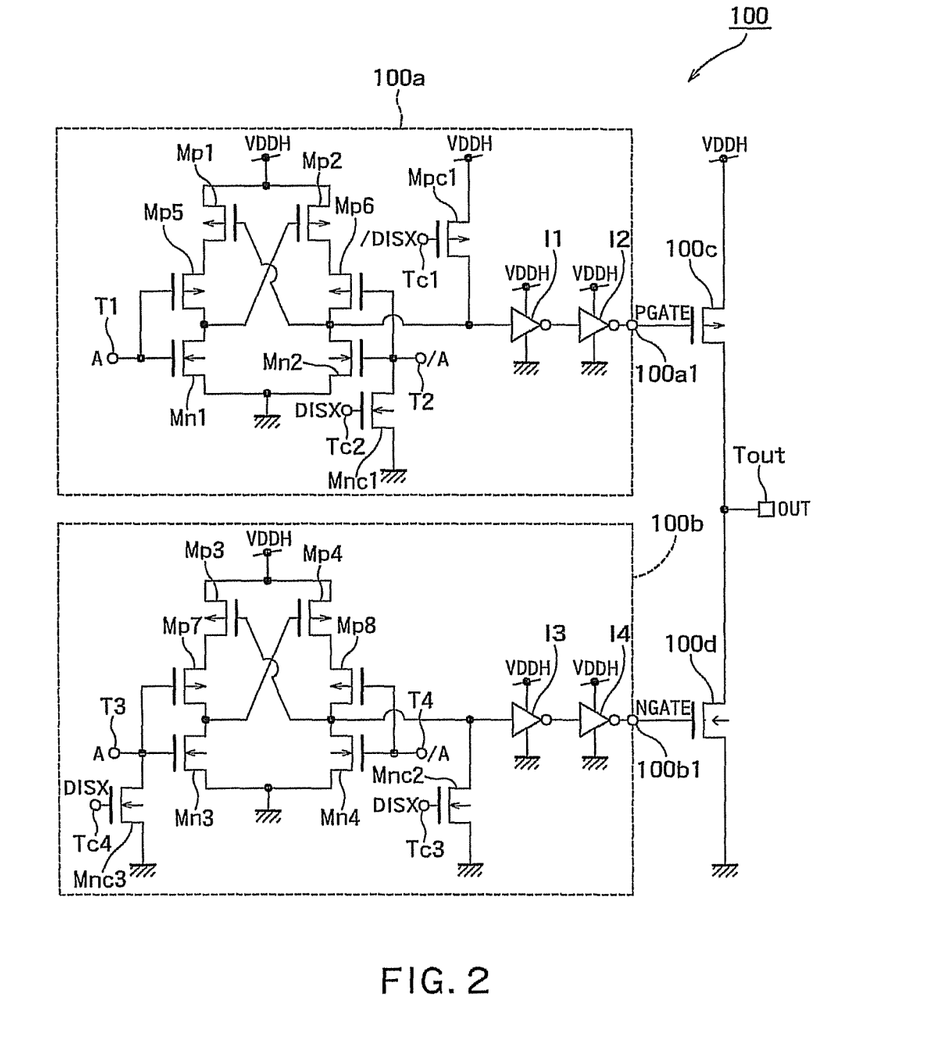
FIG. 2 is a circuit diagram showing an example of a configuration of the output circuit 100 according to the first embodiment shown in FIG. 1.

FIG. 2 is a circuit diagram showing an example of a configuration of the output circuit 100 according to the first embodiment shown in FIG. 1.

As shown in FIG. 2, the output circuit 100 includes, for example, a first level shifter circuit 100a, a second level shifter circuit 100b, an output pMOS transistor 100c, an output nMOS transistor 100d, and the output terminal Tout.

The output pMOS transistor 100c is connected at its source to the first power supply.

The output nMOS transistor 100d is connected between a drain of the output pMOS transistor 100c and ground.

The output terminal Tout is connected between drains of the output pMOS transistor 100c and the output nMOS transistor 100d.

The first level shifter circuit 100a is adapted to output a first gate control signal PGATE for controlling on/off of the output pMOS transistor 100c from a first gate control terminal 100a1.

The second level shifter circuit 100b is adapted to output a second gate control signal NGATE for controlling on/off of the output nMOS transistor 100d from a second gate control terminal 100b1.

As shown in FIG. 2, the first level shifter circuit 100a includes, for example, a first pMOS transistor Mp1, a second pMOS transistor Mp2, a fifth pMOS transistor Mp5, a sixth pMOS transistor Mp6, a first nMOS transistor Mn1, a second nMOS transistor Mn2, a first control pMOS transistor Mpc1, a first control nMOS transistor Mnc1, a first output inverter I1, and a second output inverter I2.

The first pMOS transistor Mp1 is connected at its source to the first power supply.

The first nMOS transistor Mn1 is connected between a drain of the first pMOS transistor Mp1 and the ground, and connected at its gate to a first logic terminal T1 supplied with a first logic signal A.

The second pMOS transistor Mp2 is connected at its source to the first power supply.

The second nMOS transistor Mn2 is connected between a drain of the second pMOS transistor Mp2 and the ground, and connected at its gate to a second logic terminal T2 supplied with a second logic signal /A which is obtained by inverting a logic of the first logic signal A.

The fifth pMOS transistor Mp5 is connected between drains of the first pMOS transistor Mp1 and the first nMOS transistor Mn1, and connected at its gate to the first logic terminal T1.

The sixth pMOS transistor Mp6 is connected between drains of the second pMOS transistor Mp2 and the second nMOS transistor Mn2, and connected at its gate to the second logic terminal T2.

The first control pMOS transistor Mpc1 is connected at its source to the first power supply, and connected at its drain to the drain of the second nMOS transistor Mp2. The first control pMOS transistor Mpc1 is connected at its gate to a first control terminal Tc1 which is supplied with a first output control signal /DISX based on the impedance control signal DIS.

The first control nMOS transistor Mnc1 is connected at its drain to the gate of the second nMOS transistor Mn2 and connected at its source to the ground. The first control nMOS transistor Mnc1 is connected at its gate to a second control terminal Tc2 which is supplied with a second output control signal DISX based on the impedance control signal DIS.

The first output inverter I1 is connected at its input to the drain of the first control pMOS transistor Mpc1, and supplied and driven with the first power supply voltage VDDH from the first power supply.

The second output inverter I2 is connected at its input to an output of the first output inverter I1, connected at its output to the first gate control terminal 100a1, and supplied and driven with the first power supply voltage VDDH.

As shown in FIG. 2, the second level shifter circuit 100b includes a third pMOS transistor Mp3, a third nMOS transistor Mn3, a fourth pMOS transistor Mp4, a fourth nMOS transistor Mn4, a seventh pMOS transistor Mp7, an eighth pMOS transistor Mp8, a second control nMOS transistor Mnc2, a third control nMOS transistor Mnc3, a third output inverter I3, and a fourth output inverter I4.

The third pMOS transistor Mp3 is connected at its source to the first power supply.

The third nMOS transistor Mn3 is connected between a drain of the third pMOS transistor Mp3 and the ground, and connected at its gate to a third logic terminal T3 supplied with a third logic signal A.

The fourth pMOS transistor Mp4 is connected at its source to the first power supply.

The fourth nMOS transistor Mn4 is connected between a drain of the fourth pMOS transistor Mp4 and the ground, and connected at its gate to a fourth logic terminal T4 supplied with a fourth logic signal /A which is obtained by inverting a logic of the third logic signal A.

The seventh pMOS transistor Mp7 is connected between drains of the third pMOS transistor Mp3 and the third nMOS transistor Mn3, and connected at its gate to the third logic terminal T3.

The eighth pMOS transistor Mp8 is connected between drains of the fourth pMOS transistor Mp4 and the fourth nMOS transistor Mn4, and connected at its gate to the fourth logic terminal T4.

The second control nMOS transistor Mnc2 is connected at its source to the ground, connected at its drain to the drain of the fourth nMOS transistor Mn4, and connected at its gate to a third control terminal Tc3 supplied with the second output control signal DISX.

The third control nMOS transistor Mnc3 is connected at its drain to the gate (the third logic terminal T3) of the third nMOS transistor Mn3, connected at its source to the ground, and connected at its gate to a fourth control terminal Tc4 which is supplied with the second output control signal DISX.

The third output inverter I3 is connected at its input to the drain of the second control nMOS transistor Mnc2, and supplied and driven with the first power supply voltage VDDH from the first power supply.

The fourth output inverter I4 is connected at its input to an output of the third output inverter I3, connected at its output to the second gate control terminal 100b1, and supplied and driven with the first power supply voltage VDDH from the first power supply.

In the present first embodiment, the first logic signal A is the third logic signal A as described above (and consequently the notation is also the same).

In the same way, the second logic signal /A is the fourth logic signal /A (and consequently the notation is also the same).

Furthermore, the second to fourth output control signals DISX are the same signal as described above (and consequently the notation is also the same).

Incidentally, the output pMOS transistor 100c and the output nMOS transistor 100d are set to be greater in size than the first to eighth pMOS transistors Mp1 to Mp8, the first to fourth nMOS transistors, the first control pMOS transistor Mpc1, and the first to third control nMOS transistors Mnc1 to Mnc3.

As a result, responsiveness of the output signal OUT can be improved.

Figure 3:
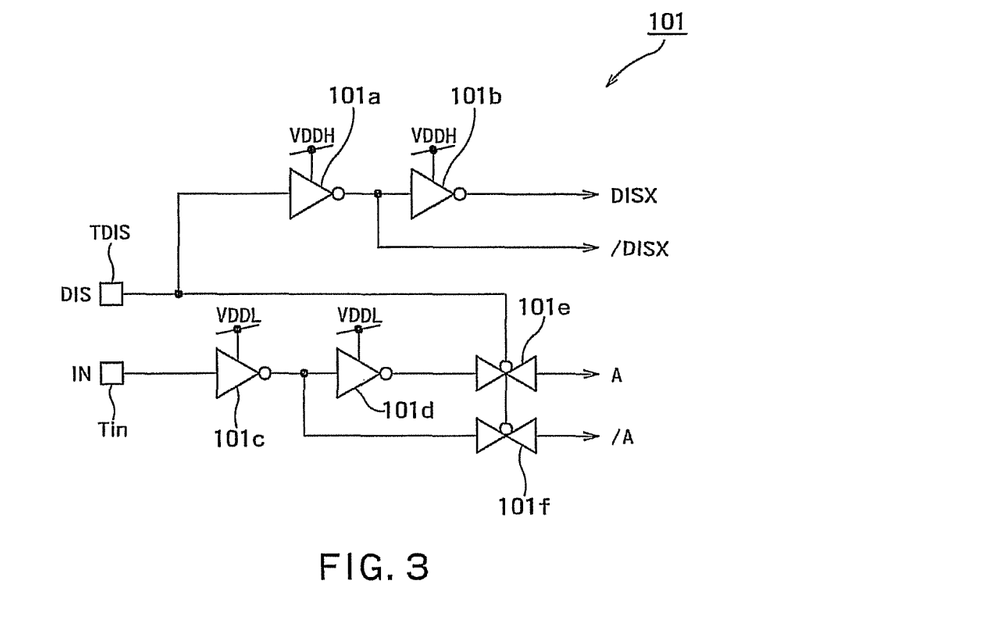
FIG. 3 is a circuit diagram showing an example of a configuration of the output control circuit 101 according to the first embodiment shown in FIG. 1.

FIG. 3 is a circuit diagram showing an example of a configuration of the output control circuit 101 according to the first embodiment shown in FIG. 1.

As shown in FIG. 3, the output control circuit 101 includes a first control inverter 101a, a second control inverter 101b, a third control inverter 101c, a fourth control inverter 101d, a first transmission gate 101e, a second transmission gate 101f, the signal input terminal Tin, and the impedance control input terminal TDIS.

The signal input terminal Tin is adapted to be supplied with the input signal IN, as already described.

The impedance control input terminal TDIS is adapted to be supplied with the impedance control signal DIS as already described.

The first control inverter 101a is adapted to be connected at its input to the impedance control input terminal TDIS, supplied and driven with the first power supply voltage VDDH from the first power supply, and output the first output control signal /DISX. In other words, an output of the first control inverter 101a is connected to the first control terminal Tc1.

The second control inverter 101b is adapted to be connected at its input to the output of the first control inverter 101a, supplied and driven with the first power supply voltage VDDH, and output the second output control signal DISX. In other words, an output of the second control inverter 101b is connected to the second to fourth control terminals Tc2 to Tc4.

The third control inverter 101c is adapted to be connected at its input to the signal input terminal Tin and supplied and driven with the second power supply voltage VDDL which is lower than the first power supply voltage VDDH and supplied from the second power supply.

The fourth control inverter 101d is adapted to be connected at its input to an output of the third control inverter 101c and supplied and driven with the second power supply voltage VDDL.

The first transmission gate 101e is connected at one end thereof to an output of the fourth control inverter 101d, connected at its gate to the impedance control input terminal TDIS, and output the first and third logic signals A from the other end thereof.

In other words, the second end of the first transmission gate 101e is connected to the first and third logic terminals T1 and T3. Accordingly, the first transmission gate 101e turns off in response to the impedance control signal DIS. As a result, the first and third logic terminals T1 and T3 (the first and third logic signals A) are brought into a high impedance state.

The second transmission gate 101f is connected at one end thereof to an output of the third control inverter 101c, connected at its gate to the impedance control input terminal TDIS, and output the second and fourth logic signals /A from the other end thereof.

In other words, the second end of the second transmission gate 101f is connected to the second and fourth logic terminals T2 and T4. Accordingly, the second transmission gate 101f turns off in response to the impedance control signal DIS. As a result, the second and fourth logic terminals T2 and T4 (the second and fourth logic signals /A) are brought into a high impedance state.

In the output control circuit 101, the first to fourth output control signals /DISX and DISX are generated from the first power supply voltage VDDH supplied by the first power supply, based on the impedance control signal DIS as described above.

In other words, a "high" level (i.e., a logic "1") of the first to fourth output control signals /DISX and DISX is, for example, the first power supply voltage VDDH. On the other hand, a "low" level (i.e., a logic "0") of the first to fourth output control signals /DISX and DISX is the ground voltage.

Furthermore, in the output control circuit 101, the first to fourth logic signals A and /A are generated from the second power supply voltage VDDL supplied by the second power supply which is different from the first power supply, based on the input signal IN.

In other words, a "high" level (i.e., a logic "1") of the first to fourth logic signals A and /A is, for example, the second power supply voltage VDDL. On the other hand, a "low" level (i.e., a logic "0") of the first to fourth logic signals /A and A is the ground voltage.

An example of operation of the output control system 1000 having the configuration described heretofore will now be described.

Figure 4:
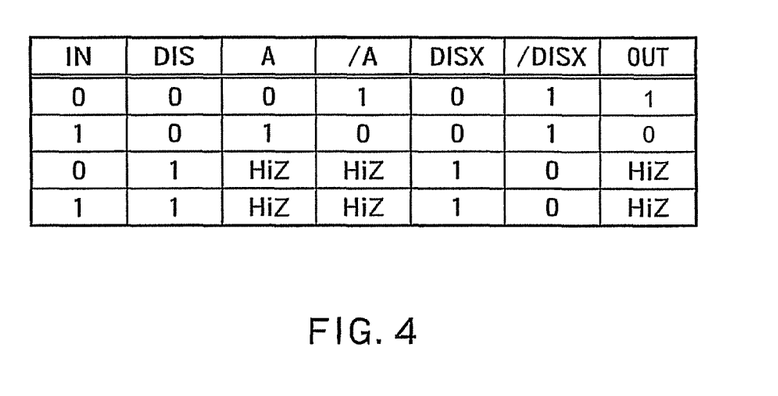
FIG. 4 is a diagram showing an example of truth values of respective signals in the output control system 1000 shown in FIG. 1.

FIG. 4 is a diagram showing an example of truth values of respective signals in the output control system 1000 shown in FIG. 1.

When using the output signal OUT of the output control system 1000, the impedance control signal DIS is set to the logic "0" ("low" level) as shown in FIG. 4.

In this case, the output control circuit 101 shown in FIG. 3 outputs the logic signals A and /A in response to the input signal IN. Furthermore, the output control circuit 101 sets the first and second output control signals /DISX and DISX to the logics "1" and "0," respectively.

In this case, the first control pMOS transistor Mpc1 and the first control nMOS transistor Mnc1 in the first level shifter circuit 100a shown in FIG. 2 turn off. Therefore, the first gate control signal PGATE depending upon the logic signals A and /A is input to the output pMOS transistor 100c at its gate.

In the same way, the second and third control nMOS transistors Mnc2 and Mnc3 in the second level shifter circuit 100b shown in FIG. 2 turn off. Therefore, the second gate control signal NGATE depending upon the logic signals A and /A is input to the output nMOS transistor 100d at its gate.

As a result, the output pMOS transistor 100c and the output nMOS transistor 100d turn on/off in a complementary manner. In other words, the output signal OUT depending upon the input signal IN is output from the output terminal Tout.

On the other hand, when not using the output signal OUT of the output control system 1000, the impedance control signal DIS is set to the logic "1" ("high" level).

In this case, the first and second transmission gates 101e and 101f in the output control circuit 101 shown in FIG. 3 turn off depending upon the impedance control signal DIS. As a result, the first to fourth logic terminals T1 to T4 (the logic signals A and /A) are brought into the high impedance state. Furthermore, the output control circuit 101 sets the first and second output control signals /DISX and DISX to the logics "0" and "1," respectively.

In this case, the first control pMOS transistor Mpc1 and the first control nMOS transistor Mnc1 in the first level shifter circuit 100a shown in FIG. 2 turn on. Therefore, the first gate control signal PGATE which assumes the "high" level (the first power supply voltage) is input to the output pMOS transistor 100c at its gate.

In the same way, the second and third control nMOS transistors Mnc2 and Mnc3 in the second level shifter circuit 100b shown in FIG. 2 turn on. Therefore, the second gate control signal NGATE which assumes the "low" level (the ground voltage) is input to the output nMOS transistor 100d at its gate.

As a result, both the output pMOS transistor 100c and the output nMOS transistor 100d turn off. In other words, the output terminal Tout is brought into the high impedance state.

In other words, in the output circuit 100, the first control pMOS transistor Mpc1 and the first to third control nMOS transistors Mnc1 to Mnc3 are turned on by the first and second output control signals /DISX and DISX based on the impedance control signal DIS. As a result, the output terminal Tout is brought into the high impedance state.

Incidentally, when not using the output signal OUT, the first and second logic terminals T1 and T2 in the first level shifter circuit 100a are brought into the high impedance state in response to the impedance control signal DIS and the first control pMOS transistor Mpc1 and the first control nMOS transistor Mnc1 turn on, as already described. As a result, at least the first pMOS transistor Mp1 and the second nMOS transistor Mn2 turn off.

Accordingly, the stand-by current in the first level shifter circuit 100a can be cut off.

In the same way, when not using the output signal OUT, the third and fourth logic terminals T3 and T4 in the second level shifter circuit 100b are brought into the high impedance state in response to the impedance control signal DIS and the second and third control nMOS transistors Mnc2 and Mnc3 turn on, as already described. As a result, at least the fourth pMOS transistor Mp4 and the third nMOS transistor Mn3 turn off.

Accordingly, the stand-by current in the second level shifter circuit 100b can be cut off.

In this way, the stand-by current does not flow in the output circuit 100 according to the present first embodiment when the output terminal Tout is in the high impedance state. In other words, switch elements for cutting off the stand-by current are not needed. As a result, the circuit area of the output circuit 100 can be reduced. In addition, the operation speed of the output circuit 100 can be increased.

Furthermore, since the output control circuit 100 is formed of inverters and switch elements, the configuration is simple and its design is easy.

According to the output circuit in the present first embodiment, the stand-by current can be cut off while attempting to shrink the circuit area as described heretofore.

Second Embodiment

The output circuit 100 already described can execute predetermined position even if signals which are different from the first to fourth logic signals and the first to fourth output control signals are used.

In the present second embodiment, therefore, an output circuit controlled by different signals will be described and an example of a configuration of an output control circuit for outputting the different signals will be described.

A general configuration of an output control system according to the present second embodiment is also the same as the output control system shown in FIG. 1.

Figure 5:
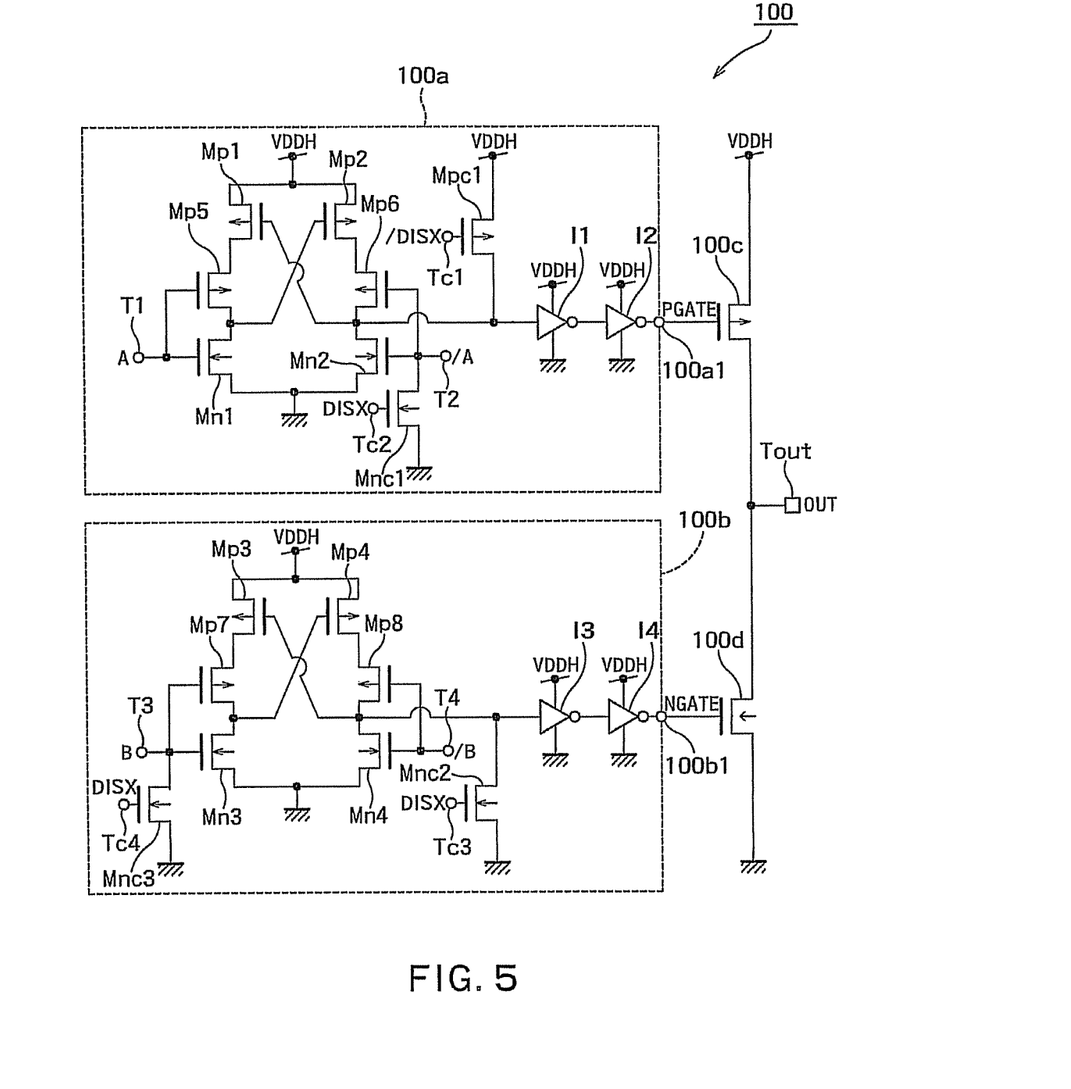
FIG. 5 is a circuit diagram showing an example of a configuration of the output circuit 100 shown in FIG. 1 according to the second embodiment.

FIG. 5 is a circuit diagram showing an example of a configuration of the output circuit 100 shown in FIG. 1 according to the second embodiment.

Although the output circuit 100 shown in FIG. 5 is the same in circuit configuration as that in the first embodiment, the output circuit 100 shown in FIG. 5 is different in signals which are input.

In other words, a third logic signal B which is different from the first logic signal A is input to the third logic terminal T3 as shown in FIG. 5. Furthermore, a fourth logic signal /B which is different from the second logic signal /A is input to the fourth logic terminal T4.

The remaining configuration of the output circuit 100 is the same as that in the first embodiment.

Figure 6:
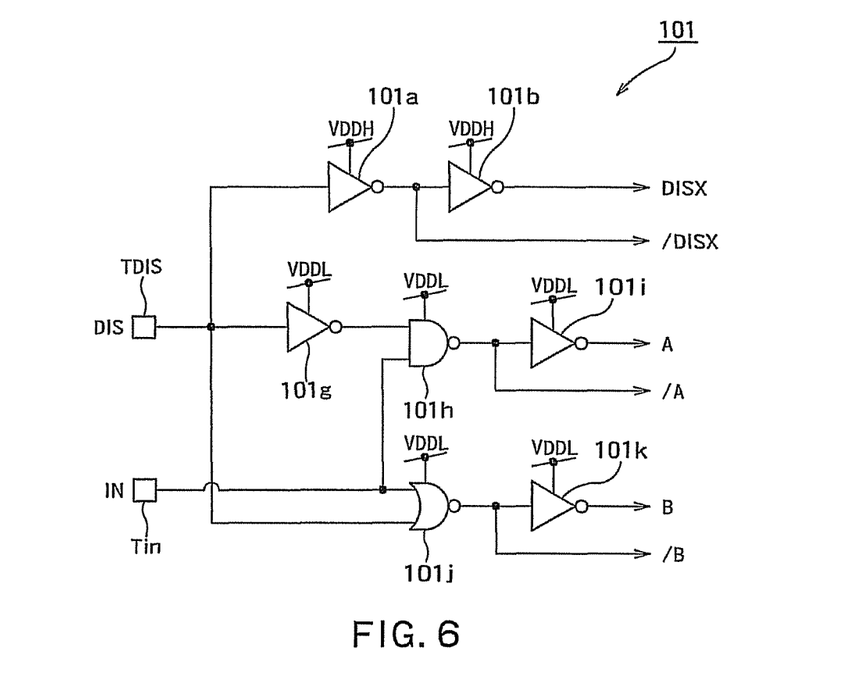
FIG. 6 is a circuit diagram showing an example of a configuration of the output control circuit 101 according to the second embodiment shown in FIG. 1.

FIG. 6 is a circuit diagram showing an example of a configuration of the output control circuit 101 according to the second embodiment shown in FIG. 1.

As shown in FIG. 6, the output control circuit 101 includes a first control inverter 101a, a second control inverter 101b, a third control inverter 101g, a fourth control inverter 101i, a fifth control inverter 101k, an AND circuit 101h, a NOR circuit 101j, the signal input terminal Tin, and the impedance control input terminal TDIS.

The signal input terminal Tin is adapted to be supplied with the input signal IN.

The impedance control input terminal TDIS is adapted to be supplied with the impedance control signal DIS.

The first control inverter 101a is adapted to be connected at its input to the impedance control input terminal TDIS, supplied and driven with the first power supply voltage VDDH from the first power supply, and output the first output control signal /DISX. In other words, an output of the first control inverter 101a is connected to the first control terminal Tc1.

The second control inverter 101b is adapted to be connected at its input to the output of the first control inverter 101a, supplied and driven with the first power supply voltage VDDH, and output the second output control signal DISX. In other words, an output of the second control inverter 101b is connected to the second to fourth control terminals Tc2 to Tc4.

The third control inverter 101g is adapted to be connected at its input to the impedance control input terminal TDIS and supplied and driven with the second power supply voltage VDDL.

The NAND circuit 101h is adapted to be connected at its input to an output of the third control inverter 101g and the signal input terminal Tin, supplied and driven with the second power supply voltage VDDL, and output the second logic signal /A. In other words, the NAND circuit 101h is connected at its output to the second logic terminal T2.

The fourth control inverter 101*i* is adapted to be connected at its input to the output of the NAND circuit 101*h*, supplied and driven with the second power supply voltage VDDL, and output the logic signal A. In other words, the output of the fourth control inverter is connected to the first logic terminal T1.

The NOR circuit 101*j* is adapted to be connected at its input to the impedance control input terminal TDIS and the signal input terminal Tin, supplied and driven with the second power supply voltage VDDL, and output the fourth logic signal /B. In other words, the output of the NOR circuit 101*j* is connected to the fourth logic terminal T4.

The fifth control inverter 101*k* is adapted to be connected at its input to the output of the NOR circuit 101*j*, supplied and driven with the second power supply voltage, and output the third logic signal B. In other words, the output of the fifth control inverter 101*k* is connected to the third logic terminal T3.

In the output control circuit 101, the first to fourth output control signals /DISX and DISX are generated from the first power supply voltage VDDH supplied by the first power supply, based on the impedance control signal DIS as described above.

In other words, a "high" level (i.e., a logic "1") of the first to fourth output control signals /DISX and DISX is, for example, the first power supply voltage VDDH. On the other hand, a "low" level (i.e., a logic "0") of the first to fourth output control signals /DISX and DISX is the ground voltage.

Furthermore, in the output control circuit 101, the first to fourth logic signals A, /A, B and /B are generated from the second power supply voltage VDDL supplied by the second power supply which is different from the first power supply, based on the input signal IN.

In other words, a "high" level (i.e., a logic "1") of the first to fourth logic signals A, /A, B and /B is, for example, the second power supply voltage VDDL. On the other hand, a "low" level (i.e., a logic "0") of the first to fourth logic signals A, /A, B and /B is the ground voltage.

An example of operation of the output control system 1000 having the configuration described heretofore will now be described.

Figure 7:
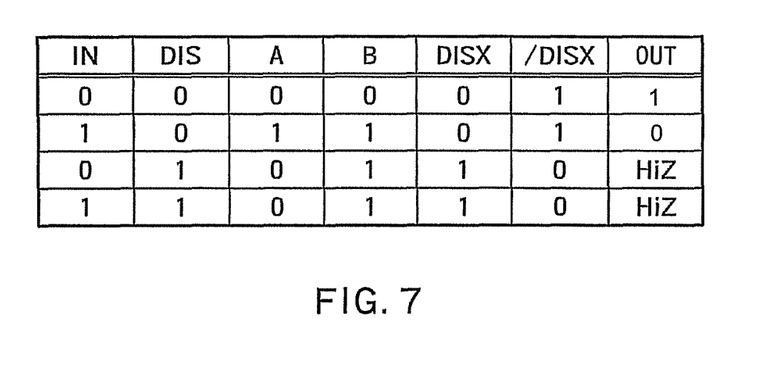
FIG. 7 is a diagram showing an example of truth values of respective signals in the output control system 1000 shown in FIG. 1.

FIG. 7 is a diagram showing an example of truth values of respective signals in the output control system 1000 shown in FIG. 1.

When using the output signal OUT of the output control system 1000, the impedance control signal DIS is set to the logic "0" ("low" level) as shown in FIG. 7.

In this case, the output control circuit 101 shown in FIG. 6 outputs the logic signals A, /A, B and /B in response to the input signal IN. Furthermore, the output control circuit 101 sets the first and second output control signals /DISX and DISX to the logics "1" and "0," respectively.

In this case, the first control pMOS transistor Mpc1 and the first control nMOS transistor Mnc1 in the first level shifter circuit 100*a* shown in FIG. 5 turn off. Therefore, the first gate control signal PGATE depending upon the logic signals A, /A, B and /B is input to the output pMOS transistor 100*c* at its gate.

In the same way, the second and third control nMOS transistors Mnc2 and Mnc3 in the second level shifter circuit 100*b* shown in FIG. 5 turn off. Therefore, the second gate control signal NGATE depending upon the logic signals A, /A, B and /B is input to the output nMOS transistor 100*d* at its gate.

As a result, the output pMOS transistor 100*c* and the output nMOS transistor 100*d* turn on/off in a complementary manner. In other words, the output signal OUT depending upon the input signal IN is output from the output terminal Tout.

On the other hand, when not using the output signal OUT of the output control system 1000, the impedance control signal DIS is set to the logic "1" ("high" level).

In this case, in the output control circuit 101 shown in FIG. 6, the output of the NAND circuit 101*h* is fixed to the logic "1" and the output of the NOR circuit 101*j* is fixed to the logic "0" by the impedance control signal DIS. As a result, the first logic signal A is fixed to the logic "0" and the second logic signal B is fixed to the logic "1." Furthermore, the output control circuit 101 sets the first and second output control signals /DISX and DISX to the logics "0" and "1" respectively in the same way as the first embodiment.

In this case, the first control pMOS transistor Mpc1 and the first control nMOS transistor Mnc1 in the first level shifter circuit 100*a* shown in FIG. 5 turn on. Therefore, the first gate control signal PGATE which assumes the "high" level (the first power supply voltage) is input to the output pMOS transistor 100*c* at its gate.

In the same way, the second and third control nMOS transistors Mnc2 and Mnc3 in the second level shifter circuit 100*b* shown in FIG. 5 turn on. Therefore, the second gate control signal NGATE which assumes the "low" level (the ground voltage) is input to the output nMOS transistor 100*d* at its gate.

As a result, both the output pMOS transistor 100*c* and the output nMOS transistor 100*d* turn off. In other words, the output terminal Tout is brought into the high impedance state.

In other words, in the output circuit 100, the first control pMOS transistor Mpc1 and the first to third control nMOS transistors Mnc1 to Mnc3 are turned on by the first and second output control signals /DISX and DISX based on the impedance control signal DIS. As a result, the output terminal Tout is brought into the high impedance state.

Incidentally, when not using the output signal OUT, the first control pMOS transistor Mpc1 and the first control nMOS transistor Mnc1 in the first level shifter circuit 100*a* turn on, as already described. As a result, at least the first pMOS transistor Mp1 and the second nMOS transistor Mn2 turn off. In addition, the first nMOS transistor Mn1 is turned on and the fifth pMOS transistor is turned off by the first logic signal A depending upon the impedance control signal DIS.

Accordingly, the stand-by current in the first level shifter circuit 100*a* can be cut off.

In the same way, when not using the output signal OUT, the second and third control nMOS transistors Mnc2 and Mnc3 turn on in the second level shifter circuit 100*b* as already described. Accordingly, at least the fourth pMOS transistor Mp4 and the third nMOS transistor Mn3 turn off. In addition, the fourth nMOS transistor Mn4 is turned on and the eighth pMOS transistor Mp8 is turned off by the fourth logic signal /B depending upon the impedance control signal DIS.

Accordingly, the stand-by current in the second level shifter circuit 100*b* can be cut off.

In this way, the stand-by current does not flow in the output circuit 100 according to the present second embodiment when the output terminal Tout is in the high impedance state. In other words, switch elements for cutting off the stand-by current are not needed. As a result, the circuit area of the output circuit 100 can be reduced. In addition, the operation speed of the output circuit 100 can be increased.

Furthermore, since the output control circuit 100 is formed of inverters and switch elements, the configuration is simple and its design is easy.

According to the output circuit in the present second embodiment, the stand-by current can be cut off while attempting to shrink the circuit area in the same way as the first embodiment as described heretofore.

Third Embodiment

Even if the fifth to eighth pMOS transistors Mp5 to Mp8 are removed in the first and second level shifter circuits 100a and 100b in the second embodiment already described, the output circuit 100 can cut off the stand-by current when not using the output signal OUT.

In the present third embodiment, therefore, a configuration example of the output circuit 100 obtained by removing the fifth to eighth pMOS transistors Mp5 to Mp8 are removed in the first and second level shifter circuits 100a and 100b will be described.

A general configuration of an output control system according to the present third embodiment is also the same as the output control system shown in FIG. 1.

Figure 8:
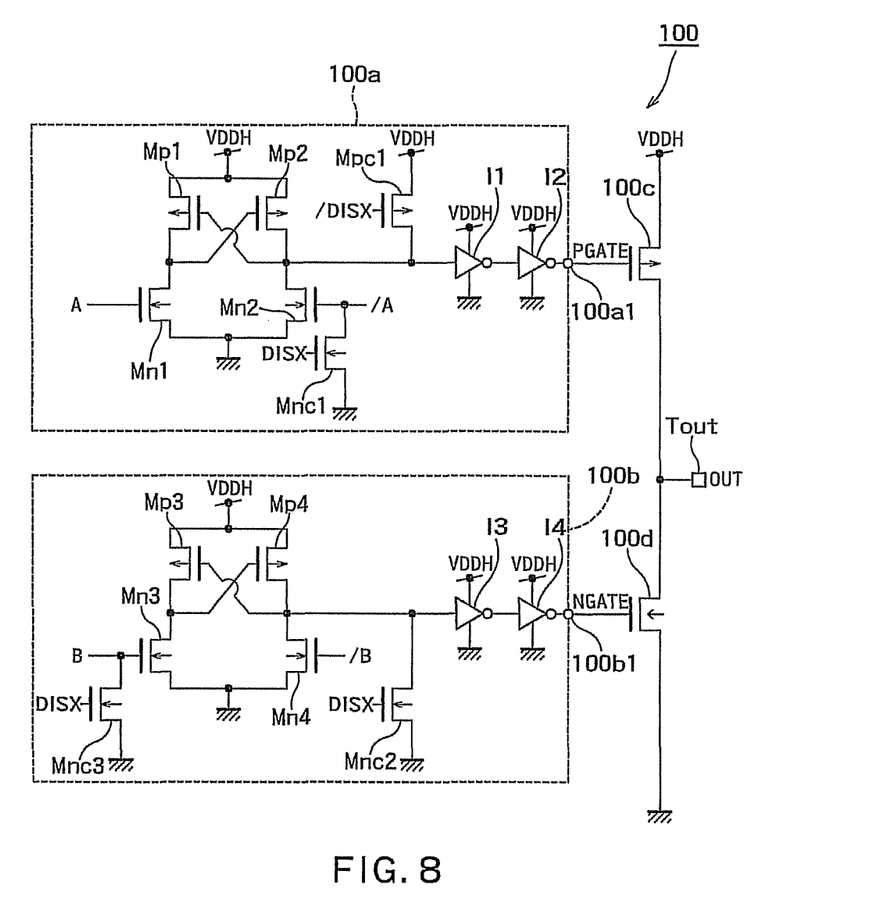
FIG. 8 is a circuit diagram showing an example of a configuration of the output circuit 100 shown in FIG. 1 according to the third embodiment.

FIG. 8 is a circuit diagram showing an example of a configuration of the output circuit 100 shown in FIG. 1 according to the third embodiment.

As shown in FIG. 8, the output circuit 100 includes a first level shifter circuit 100a, a second level shifter circuit 100b, an output pMOS transistor 100c, an output nMOS transistor 100d, and the output terminal Tout. And the first level shifter circuit 100a includes, for example, a first pMOS transistor Mp1, a second pMOS transistor Mp2, a first nMOS transistor Mn1, a second nMOS transistor Mn2, a first control pMOS transistor Mpc1, a first control nMOS transistor Mnc1, a first output inverter I1, and a second output inverter I2.

Furthermore, the second level shifter circuit 100b includes, for example, a third pMOS transistor Mp3, a third nMOS transistor Mn3, a fourth pMOS transistor Mp4, a fourth nMOS transistor Mn4, a second control nMOS transistor Mnc2, a third control nMOS transistor Mnc3, a third output inverter I3, and a fourth output inverter I4.

In other words, in the output circuit 100, the fifth to eighth pMOS transistors Mp5 to Mp8 in the first and second level shifter circuits 100a and 100b are removed as compared with the second embodiment. In other words, drains of the first pMOS transistor Mp1 and the first nMOS transistor Mn1 are connected together, drains of the second pMOS transistor Mp2 and the second nMOS transistor Mn2 are connected together, drains of the third pMOS transistor Mp3 and the third nMOS transistor Mn3 are connected together, and drains of the fourth pMOS transistor Mp4 and the fourth nMOS transistor Mn4 are connected together.

Incidentally, the configuration of the output control circuit 101 which generates signals input to the output circuit 100 shown in FIG. 8 is the same as that in the second embodiment.

Operation of the output control system 1000 having the output circuit 100 described heretofore is the same as that in the second embodiment except the operation of the fifth to eighth pMOS transistors Mp6 to Mp8 is removed. In other words, truth values of respective signals in the output control system 1000 become the same, for example, as shown in FIG. 7.

For example, when using the output signal OUT of the output control system 1000, the impedance control signal DIS is set to the logic "0" ("low" level) in the same way as the second embodiment.

In this case, the first control pMOS transistor Mpc1 and the first control nMOS transistor Mnc1 in the first level shifter circuit 100a shown in FIG. 8 turn off. Therefore, the first gate control signal PGATE depending upon the logic signals A, /A, B and /B is input to the output pMOS transistor 100c at its gate.

In the same way, the second and third control nMOS transistors. Mnc2 and Mnc3 in the second level shifter circuit 100b shown in FIG. 8 turn off. Therefore, the second gate control signal NGATE depending upon the logic signals A, /A, B and /B is input to the output nMOS transistor 100d at its gate.

As a result, the output pMOS transistor 100c and the output nMOS transistor 100d turn on/off in a complementary manner. In other words, the output signal OUT depending upon the input signal IN is output from the output terminal Tout.

On the other hand, when not using the output signal OUT of the output control system 1000, the impedance control signal DIS is set to the logic "1" ("high" level) in the same way as the second embodiment.

In this case, the first control pMOS transistor Mpc1 and the first control nMOS transistor Mnc1 in the first level shifter circuit 100a shown in FIG. 8 turn on. Therefore, the first gate control signal PGATE which assumes the "high" level (the first power supply voltage) is input to the output pMOS transistor 100c at its gate.

In the same way, the second and third control nMOS transistors Mnc2 and Mnc3 in the second level shifter circuit 100b shown in FIG. 8 turn on. Therefore, the second gate control signal NGATE which assumes the "low" level (the ground voltage) is input to the output nMOS transistor 100d at its gate.

As a result, both the output pMOS transistor 100c and the output nMOS transistor 100d turn off. In other words, the output terminal Tout is brought into the high impedance state.

In other words, in the output circuit 100, the first control pMOS transistor Mpc1 and the first to third control nMOS transistors Mnc1 to Mnc3 are turned on by the first and second output control signals /DISX and DISX based on the impedance control signal DIS. As a result, the output terminal Tout is brought into the high impedance state.

Incidentally, when not using the output signal OUT, the first control pMOS transistor Mpc1 and the first control nMOS transistor Mnc1 in the first level shifter circuit 100a turn on, as already described. As a result, at least the first pMOS transistor Mp1 and the second nMOS transistor Mn2 turn off.

Accordingly, the stand-by current in the first level shifter circuit 100a can be cut off.

In the same way, when not using the output signal OUT, the second and third control nMOS transistors Mnc2 and Mnc3 turn on in the second level shifter circuit 100b as already described. Accordingly, at least the fourth pMOS transistor Mp4 and the third nMOS transistor Mn3 turn off.

Accordingly, the stand-by current in the second level shifter circuit 100b can be cut off.

In this way, the stand-by current does not flow in the output circuit 100 according to the present third embodiment when the output terminal Tout is in the high impedance state. In other words, switch elements for cutting off the stand-by current are not needed. As a result, the circuit area of the output circuit 100 can be reduced. In addition, the operation speed of the output circuit 100 can be increased.

Furthermore, since the output control circuit 100 is formed of inverters and switch elements, the configuration is simple and its design is easy.

According to the output circuit in the present third embodiment, the stand-by current can be cut off while attempting to shrink the circuit area in the same way as the second embodiment as described heretofore.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An output circuit which outputs an output signal based on an input signal from an output terminal and brings the output terminal into a high impedance state in response to an impedance control signal, the output circuit comprising:
an output pMOS transistor connected at a source thereof to a first power supply;
an output nMOS transistor connected between a drain of the output pMOS transistor and ground;
an output terminal connected between the drain of the output pMOS transistor and a drain of the output nMOS transistor;
a first level shifter circuit which outputs a first gate control signal from a first gate control terminal to control on/off of the output pMOS transistor; and
a second level shifter circuit which outputs a second gate control signal from a second gate control terminal to control on/off of the output nMOS transistor,
wherein
the first level shifter circuit includes:
a first pMOS transistor connected at a source thereof to the first power supply;
a first nMOS transistor connected between a drain of the first pMOS transistor and the ground, and connected at a gate thereof to a first logic terminal supplied with a first logic signal;
a second pMOS transistor connected at a source thereof to the first power supply;
a second nMOS transistor connected between a drain of the second pMOS transistor and the ground, and connected at a gate thereof to a second logic terminal supplied with a second logic signal which is obtained by inverting a logic of the first logic signal;
a first control pMOS transistor connected at a source thereof to the first power supply, connected at a drain thereof to a drain of the second pMOS transistor, and connected at a gate thereof to a first control terminal supplied with a first output control signal based on the impedance control signal; and
a first control nMOS transistor connected at a drain thereof to the gate of the second nMOS transistor, connected at a source to the ground, and connected at a gate thereof to a second control terminal supplied with a second output control signal based on the impedance control signal,
the second level shifter circuit includes:
a third pMOS transistor connected at a source to the first power supply;
a third nMOS transistor connected between a drain of the third pMOS transistor and the ground, and connected at a gate thereof to a third logic terminal supplied with a third logic signal;
a fourth pMOS transistor connected at a source thereof to the first power supply;
a fourth nMOS transistor connected between a drain of the fourth pMOS transistor and the ground, and connected at a gate thereof to a fourth logic terminal supplied with a fourth logic signal which is obtained by inverting a logic of the third logic signal;
a second control nMOS transistor connected at a source thereof to the ground, connected at a drain thereof to a drain of the fourth nMOS transistor, and connected at a gate thereof to a third control terminal supplied with the second output control signal; and
a third control nMOS transistor connected at a drain thereof to the gate of the third nMOS transistor, connected at a source thereof to the ground, and connected at a gate thereof to a fourth control terminal supplied with the second output control signal.

2. The output circuit according to claim 1, wherein the first level shifter circuit further includes:
a fifth pMOS transistor connected between the drain of the first pMOS transistor and a drain of the first nMOS transistor, and connected at a gate thereof to the first logic terminal; and
a sixth pMOS transistor connected between the drain of the second pMOS transistor and the drain of the second nMOS transistor, and connected at a gate thereof to the second logic terminal,
the second level shifter circuit further includes:
a seventh pMOS transistor connected between the drain of the third pMOS transistor and a drain of the third nMOS transistor, and connected at a gate thereof to the third logic terminal; and
an eighth pMOS transistor connected between the drain of the fourth pMOS transistor and the drain of the fourth nMOS transistor, and connected at a gate thereof to the fourth logic terminal,
the first logic signal is the third logic signal, and
when the first to fourth logic terminals are brought into a high impedance state in response to the impedance control signal and the first control pMOS transistor and the first to third control nMOS transistors are turned on by the first and second output control signals based on the impedance control signal, so that the output terminal is brought into the high impedance state.

3. The output circuit according to claim 1, wherein the first level shifter circuit further includes:
a fifth pMOS transistor connected between the drain of the first pMOS transistor and a drain of the first nMOS transistor, and connected at a gate thereof to the first logic terminal; and
a sixth pMOS transistor connected between the drain of the second pMOS transistor and the drain of the second nMOS transistor, and connected at a gate thereof to the second logic terminal,
the second level shifter circuit further includes:
a seventh pMOS transistor connected between the drain of the third pMOS transistor and a drain of the third nMOS transistor, and connected at a gate thereof to the third logic terminal; and
an eighth pMOS transistor connected between the drain of the fourth pMOS transistor and the drain of the fourth nMOS transistor, and connected at a gate thereof to the fourth logic terminal,
when the first nMOS transistor is turned on and the fifth pMOS transistor is turned off by the first logic signal based on the impedance control signal, the fourth nMOS transistor is turned on and the eighth pMOS transistor is turned off by the fourth logic signal based on the impedance control signal, and the first control pMOS transistor and the first to third control nMOS transistors are turned on by the first and second output control signals based on the impedance control signal, so that the output terminal is brought into the high impedance state.

4. The output circuit according to claim 1, wherein each of the output pMOS transistor and the output nMOS transistor is greater in size than each of the first to fourth pMOS transistors, the first to fourth nMOS transistors, the first control pMOS transistor, and the first to third control nMOS transistors.

5. The output circuit according to claim 1, wherein
the first and second output control signals are generated from a first power supply voltage which is supplied by the first power supply, based on the impedance control signal,
the first to fourth logic signals are generated from a second power supply voltage which is supplied from a second power supply different from the first power supply, based on the input signal, and
the first power supply voltage is higher than the second power supply voltage.

6. The output circuit according to claim 1,
wherein the first level shifter circuit further includes:
a first output inverter which is connected at an input thereof to the drain of the first control pMOS transistor and supplied and driven with the first power supply voltage from the first power supply; and
a second output inverter connected at an input thereof to an output of the first output inverter, connected at an output thereof to the first gate control terminal, and supplied and driven with the first power supply voltage, and
wherein the second level shifter circuit further includes:
a third output inverter which is connected at an input thereof to the drain of the second control nMOS transistor and supplied and driven with the first power supply voltage; and
a fourth output inverter connected at an input thereof to an output of the third output inverter, connected at an output thereof to the second gate control terminal, and supplied and driven with the first power supply voltage.

7. The output circuit according to claim 2,
wherein the first level shifter circuit further includes:
a first output inverter which is connected at an input thereof to the drain of the first control pMOS transistor and supplied and driven with the first power supply voltage from the first power supply; and
a second output inverter connected at an input thereof to an output of the first output inverter, connected at an output thereof to the first gate control terminal, and supplied and driven with the first power supply voltage, and
wherein the second level shifter circuit further includes:
a third output inverter which is connected at an input thereof to the drain of the second control nMOS transistor and supplied and driven with the first power supply voltage; and
a fourth output inverter connected at an input thereof to an output of the third output inverter, connected at an output thereof to the second gate control terminal, and supplied and driven with the first power supply voltage.

8. The output circuit according to claim 3,
wherein the first level shifter circuit further includes:
a first output inverter which is connected at an input thereof to the drain of the first control pMOS transistor and supplied and driven with the first power supply voltage from the first power supply; and
a second output inverter connected at an input thereof to an output of the first output inverter, connected at an output thereof to the first gate control terminal, and supplied and driven with the first power supply voltage, and
wherein the second level shifter circuit further includes:
a third output inverter which is connected at an input thereof to the drain of the second control nMOS transistor and supplied and driven with the first power supply voltage; and a fourth output inverter connected at an input thereof to an output of the third output inverter, connected at an output thereof to the second gate control terminal, and supplied and driven with the first power supply voltage.

9. The output circuit according to claim 1, wherein
the output signal is supplied to a NAND flash memory driven with a first power supply voltage, and
the input signal is supplied from a controller which is driven with a second power supply voltage lower than the first power supply voltage and which controls the NAND flash memory.

10. The output circuit according to claim 2, wherein
the output signal is supplied to a NAND flash memory driven with a first power supply voltage, and
the input signal is supplied from a controller which is driven with a second power supply voltage lower than the first power supply voltage and which controls the NAND flash memory.

11. An output control system comprising:
an output control circuit which outputs an' logic signal based on an input signal and outputs an output control signal based on an impedance control signal; and
an output circuit which outputs an output signal in response to the logic signal from an output terminal and brings the output terminal into a high impedance state in response to the output control signal,
wherein the output circuit comprising:
an output pMOS transistor connected at a source thereof to a first power supply;
an output nMOS transistor connected between a drain of the output pMOS transistor and ground;
an output terminal connected between the drain of the output pMOS transistor and a drain of the output nMOS transistor;
a first level shifter circuit which outputs a first gate control signal from a first gate control terminal to control on/off of the output pMOS transistor; and
a second level shifter circuit which outputs a second gate control signal from a second gate control terminal to control on/off of the output nMOS transistor,
wherein
the first level shifter circuit includes:
a first pMOS transistor connected at a source thereof to the first power supply;
a first nMOS transistor connected between a drain of the first pMOS transistor and the ground, and connected at a gate thereof to a first logic terminal supplied with a first logic signal;
a second pMOS transistor connected at a source thereof to the first power supply;
a second nMOS transistor connected between a drain of the second pMOS transistor and the ground, and connected at a gate thereof to a second logic terminal supplied with a second logic signal which is obtained by inverting a logic of the first logic signal;
a first control pMOS transistor connected at a source thereof to the first power supply, connected at a drain thereof to a drain of the second pMOS transistor, and connected at a gate thereof to a first control terminal supplied with a first output control signal based on the impedance control signal; and
a first control nMOS transistor connected at a drain thereof to the gate of the second nMOS transistor, connected at a source to the ground, and connected at a gate thereof to a second control terminal supplied with a second output control signal based on the impedance control signal,
the second level shifter circuit includes:

a third pMOS transistor connected at a source to the first power supply;

a third nMOS transistor connected between a drain of the third pMOS transistor and the ground, and connected at a gate thereof to a third logic terminal supplied with a third logic signal;

a fourth pMOS transistor connected at a source thereof to the first power supply;

a fourth nMOS transistor connected between a drain of the fourth pMOS transistor and the ground, and connected at a gate thereof to a fourth logic terminal supplied with a fourth logic signal which is obtained by inverting a logic of the third logic signal;

a second control nMOS transistor connected at a source thereof to the ground, connected at a drain thereof to a drain of the fourth nMOS transistor, and connected at a gate thereof to a third control terminal supplied with the second output control signal; and a third control nMOS transistor connected at a drain thereof to the gate of the third nMOS transistor, connected at a source thereof to the ground, and connected at a gate thereof to a fourth control terminal supplied with the second output control signal.

12. The output control system according to claim 11, wherein the output control circuit comprises:

a signal input terminal supplied with the input signal;

an impedance control input terminal supplied with the impedance control signal;

a first control inverter which is connected at an input thereof to the signal input terminal, and supplied and driven with a first power supply voltage from the first power supply, and which outputs the first output control signal;

a second control inverter which is connected at an input to an output of the first control inverter, and supplied and driven with the first power supply voltage, and which outputs the second output control signal;

a third control inverter which is connected at an input thereof to the signal input terminal, and supplied and driven with a second power supply voltage lower than the first power supply voltage supplied from the second power supply;

a fourth control inverter connected at an input thereof to an output of the third control inverter and supplied and driven with the second power supply voltage;

a first transmission gate which is connected at one end thereof to an output of the fourth control inverter, and connected at a gate thereof to the impedance control input terminal, and which outputs the first logic signal from the other end thereof; and a second transmission gate which is connected at one end thereof to an output of the third control inverter, and connected at a gate thereof to the impedance control input terminal, and which outputs the second logic signal from the other end thereof.

13. The output control system according to claim 11, wherein the output control circuit comprises:

a signal input terminal supplied with the input signal;

an impedance control input terminal supplied with the impedance control signal;

a first control inverter which is connected at an input thereof to the signal input terminal, and supplied and driven with a first power supply voltage from the first power supply, and which outputs the first output control signal;

a second control inverter which is connected at an input to an output of the first control inverter, and supplied and driven with the first power supply voltage, and which outputs the second output control signal;

a third control inverter which is connected at an input thereof to the impedance control input terminal, and supplied and driven with a second power supply voltage lower than the first power supply voltage supplied from the second power supply;

a NAND circuit which is connected at an input thereof to an output of the third control inverter and the signal input terminal, supplied and driven with the second power supply voltage, and outputs the second logic signal;

a fourth control inverter which is connected at an input thereof to the output of the NAND circuit, supplied and driven with the second power supply voltage, and outputs the logic signal;

a NOR circuit which is connected at an input thereof to the impedance control input terminal and the signal input terminal, supplied and driven with the second power supply voltage, and outputs the fourth logic signal; and a fifth control inverter which is connected at an input thereof to the output of the NOR circuit, supplied and driven with the second power supply voltage, and outputs the third logic signal.

14. The output control system according to claim 11, wherein each of the output pMOS transistor and the output nMOS transistor is greater in size than each of the first to fourth pMOS transistors, the first to fourth nMOS transistors, the first control pMOS transistor, and the first to third control nMOS transistors.

15. The output control system according to claim 11, wherein the first and second output control signals are generated from a first power supply voltage which is supplied by the first power supply, based on the impedance control signal, the first to fourth logic signals are generated from a second power supply voltage which is supplied from a second power supply different from the first power supply, based on the input signal, and the first power supply voltage is higher than the second power supply voltage.

16. The output control system according to claim 11, wherein the first level shifter circuit further includes:

a first output inverter which is connected at an input thereof to the drain of the first control pMOS transistor and supplied and driven with the first power supply voltage from the first power supply; and a second output inverter connected at an input thereof to an output of the first output inverter, connected at an output thereof to the first gate control terminal, and supplied and driven with the first power supply voltage, and wherein the second level shifter circuit further includes:

a third output inverter which is connected at an input thereof to the drain of the second control nMOS transistor and supplied and driven with the first power supply voltage; and a fourth output inverter connected at an input thereof to an output of the third output inverter, connected at an output thereof to the second gate control terminal, and supplied and driven with the first power supply voltage.

17. The output control system according to claim 12, wherein the first level shifter circuit further includes:

a first output inverter which is connected at an input thereof to the drain of the first control pMOS transistor and supplied and driven with the first power supply voltage from the first power supply; and a second output inverter connected at an input thereof to an output of the first output inverter, connected at an output thereof to the first gate control terminal, and supplied and driven with the first power supply voltage, and wherein the second level shifter circuit further includes:

a third output inverter which is connected at an input thereof to the drain of the second control nMOS transistor and supplied and driven with the first power supply voltage; and a fourth output inverter connected at an input thereof to an output of the third output inverter, connected at an output thereof to the second gate control terminal, and supplied and driven with the first power supply voltage.

18. The output control system according to claim 13, wherein the first level shifter circuit further includes:

a first output inverter which is connected at an input thereof to the drain of the first control pMOS transistor and supplied and driven with the first power supply voltage from the first power supply; and a second output inverter connected at an input thereof to an output of the first output inverter, connected at an output thereof to the first gate control terminal, and supplied and driven with the first power supply voltage, and wherein the second level shifter circuit further includes:

a third output inverter which is connected at an input thereof to the drain of the second control nMOS transistor and supplied and driven with the first power supply voltage; and a fourth output inverter connected at an input thereof to an output of the third output inverter, connected at an output thereof to the second gate control terminal, and supplied and driven with the first power supply voltage.

19. The output control system according to claim 11, wherein the output signal is supplied to a NAND flash memory driven with a first power supply voltage, and the input signal is supplied from a controller which is driven with a second power supply voltage lower than the first power supply voltage and which controls the NAND flash memory.

20. The output control system according to claim 12, wherein the output signal is supplied to a NAND flash memory driven with a first power supply voltage, and the input signal is supplied from a controller which is driven with a second power supply voltage lower than the first power supply voltage and which controls the NAND flash memory.

* * * * *